(12) United States Patent
Woodruff et al.

(10) Patent No.: US 7,420,690 B2
(45) Date of Patent: Sep. 2, 2008

(54) END POINT DETECTION IN WORKPIECE PROCESSING

(75) Inventors: Daniel J. Woodruff, Kalispell, MT (US); Marvin Louis Bernt, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 334 days.

(21) Appl. No.: 11/288,770

(22) Filed: Nov. 28, 2005

(65) Prior Publication Data
US 2007/0121123 A1 May 31, 2007

(51) Int. Cl.
G01B 11/28 (2006.01)
G01N 21/55 (2006.01)
G01R 31/26 (2006.01)
H01L 21/66 (2006.01)

(52) U.S. Cl. .................. 356/630; 356/445; 438/16
(58) Field of Classification Search .............. None
See application file for complete search history.

(56) References Cited
U.S. PATENT DOCUMENTS 5,032,217 A    7/1991  Tanaka
5,490,728 A *  2/1996  Schietinger et al. ............ 374/7
6,306,563 B1 * 10/2001  Xu et al. ...................... 430/321
6,712,927 B1 *  3/2004  Grimbergen et al. ... 156/345.24
6,762,849 B1 *  7/2004  Rulkens ..................... 356/630
6,882,416 B1 *  4/2005  Hunter et al. ............ 356/237.4
6,934,040 B1 *  8/2005  Schietinger et al. ......... 356/630
2005/0064802 A1 *  3/2005  Wiswesser et al. .......... 451/285

OTHER PUBLICATIONS

Combined International Search Report and Written Opinion for PCT/US06/44812, dated Jan. 4, 2008 (11 pages).

* cited by examiner

Primary Examiner—Gregory J. Toatley, Jr.
Assistant Examiner—Gordon J Stock, Jr.
(74) Attorney, Agent, or Firm—Kenneth H. Ohriner; Perkins Coie LLP

(57) ABSTRACT

In a workpiece process end point detection system, light is diffused and then light intensity or color is sensed. Optical noise is greatly reduced and more accurate end point detection can be made. A light emitter and a light sensor may be located within a workpiece process chamber. A housing around the light emitter and the light sensor seals out process fluids and also diffuses light passing through. The diffused light may be optically filtered before reaching the light sensor.

18 Claims, 8 Drawing Sheets

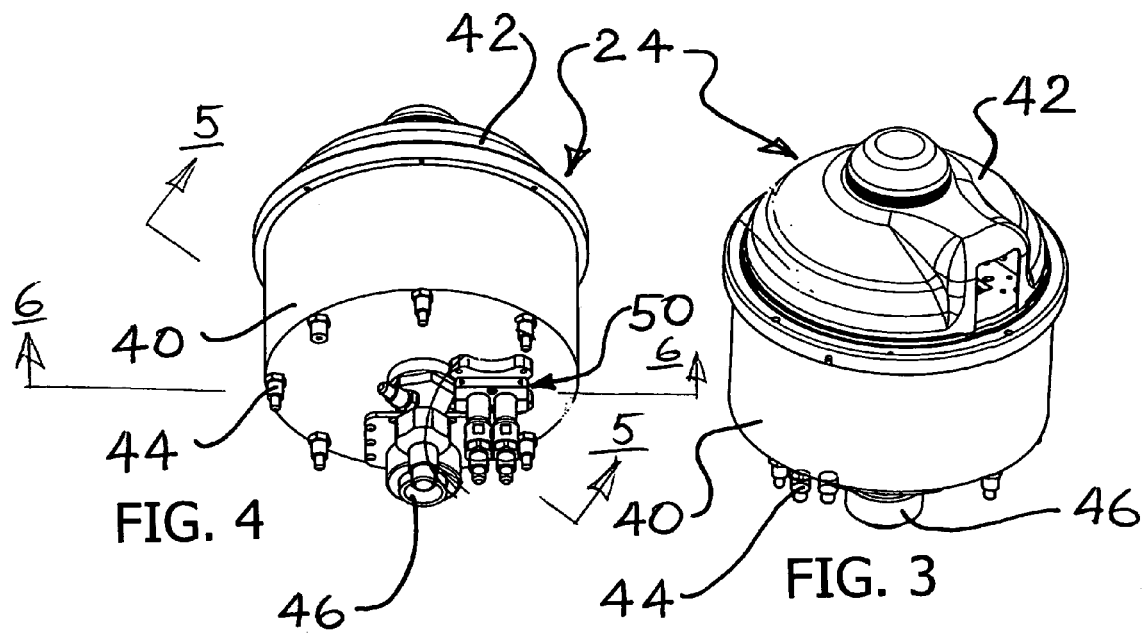
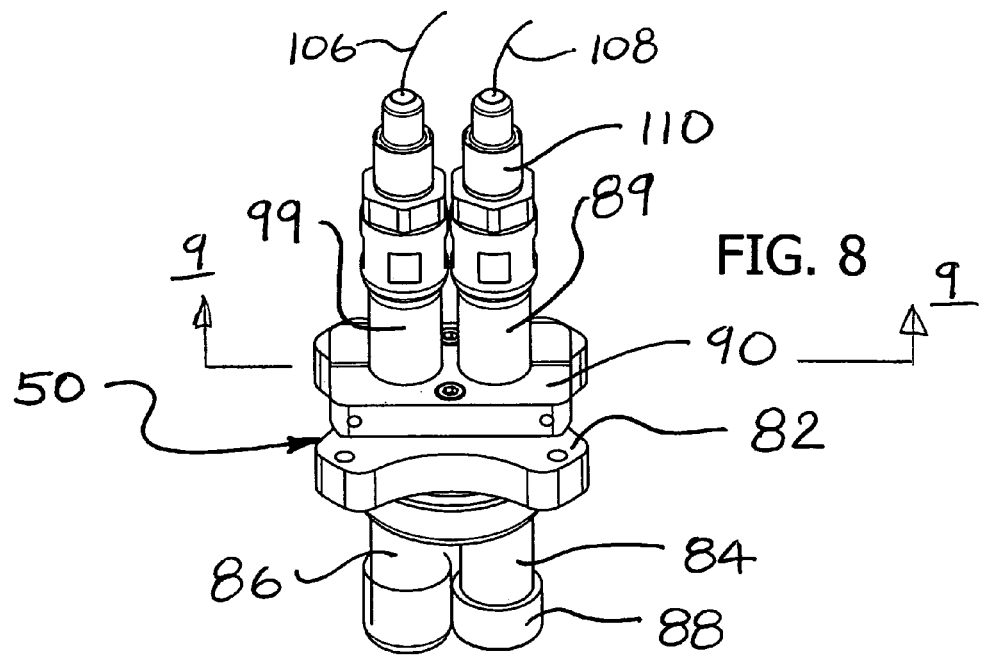

END POINT DETECTION IN WORKPIECE PROCESSING

BACKGROUND OF THE INVENTION

The invention relates to processing of workpieces, such as semiconductor wafers. Semiconductor and similar microscale devices are typically manufactured by performing many separate steps on substrates or wafers. The workpieces are often coated or plated with multiple layers or films of different materials. Process chemicals, typically etchants in liquid form, are applied to the workpieces to selectively remove one or more layers. Often, a layer on the workpiece is patterned generally using photolithographic methods, and only portions of the layer are removed.

In workpiece processing, it is often important to determine the end point of a process. In a layer or film removal process, the end point is defined as the point at which all of the targeted layer has been removed, exposing an underlying layer beneath the targeted layer. Extensive processing after the end point can waste time and process chemicals, and even damage the workpiece in more extreme cases. On workpieces patterned with photoresist, continuing to process the workpiece beyond the end point may undercut the photoresist and decrease the critical dimension of the microscopic device features formed on the workpiece. On the other hand, if a process is stopped before the correct end point, the workpiece will not be fully processed. For example, a layer of material which must be removed to achieve proper manufacturing may partially remain on the workpiece, or remain on certain areas of the workpiece. As a result, the workpiece would then require re-work, or have to be discarded.

In the past, the process time of etching processes has been determined strictly by a specific predetermined time interval (e.g., 120 seconds) which is known to be sufficient to remove the film and also include some over-etch to insure complete processing. Etching process times have also been determined visually by observing the workpiece through a window in the process chamber and noting a color change as the underlying film is exposed. A human operator then adjusts the process time, process chemical flow rates, or other parameters to try to optimize the processing, independent of variations that may arise, such as changes in process chemical concentration, temperature, variations in film thickness and film quality, etc.

Various automated methods using sensors and computers have largely replaced visual end point detection by a human operator. These methods include using electrical, optical, or even chemical measurements. Optical techniques are advantageous as they can be fast, reliable, and easier to perform. With optical end point detection methods, light intensity and/or color is measured. The end point is reached when a predefined condition in the intensity profile is met. However, in cases where the intensity change is slight, for example where color change between films is subtle, or where the percentage of area cleared is low, electronic or optical noise can mask detection of the endpoint. In addition, some process chambers are made of plastic materials, to better resist corrosion by process chemicals. These plastic materials, including fluorine resin materials, are not necessarily opaque. As a result, stray light may penetrate into the chamber, making it more difficult to achieve accurate optical measurements. Reflection and diffraction of light in the process chamber by droplets of chemical process liquids may also create errors in optical measurements. As a result engineering challenges remain in the design of optical end point detection.

SUMMARY OF THE INVENTION

A novel end point detection system has now been developed which overcomes the drawbacks of existing systems and also provides additional advantages. In one aspect, the present end point detection system diffuses emitted light directed at the workpiece, and/or reflected light impinging on a light detecting element. By diffusing the light, optical noise (for example resulting from a spray of liquid inside the process chamber) is greatly reduced. Accurate end point detection is improved.

In another and separate aspect, a light emitter and a light detector are located within a workpiece process chamber. A housing around the light emitter and the light detector in the process chamber, is at least partially translucent, allowing sufficient light to pass through to perform end point detection. The housing may also prevent potentially corrosive process liquids or gasses from coming into contact with the light emitter and detector. Placing the light emitter and detector within the process chamber provides for accurate end point detection with a highly compact system. Precise positioning or alignment of optical elements is also not necessary, as the system does not rely on specular reflected light.

In another and separate aspect, in a method of end point detection, light from a light source in a process chamber is diffused and directed generally towards a workpiece. A process fluid, such as a liquid etchant, is applied to the workpiece, typically while the workpiece is spinning. The process fluid removes a film on the workpiece surface. This causes a change in one or more optical properties of the workpiece, such as reflectance and color. Light reflected from the workpiece is detected via a light detector also in the process chamber. The reflected light may be diffused before it is detected. An output signal from the light detector is used to determine a process end point. The light reflected off of the workpiece may optionally be filtered before it is detected.

The invention resides as well in subcombinations of the systems, components, and method steps shown and described. The invention may of course be practiced in other forms without necessarily achieving each of the advantages described.

BRIEF DESCRIPTION OF THE DRAWINGS

FIG. 3 is a top perspective view of one of the processors shown in FIG. 2.

FIG. 4 is a bottom perspective view of the processor shown in FIG. 3.

FIG. 8 is an inverted perspective view of the end point detector shown in FIGS. 6 and 7.

DETAILED DESCRIPTION

The systems and methods described may be used to process workpieces, such as semiconductor wafers, flat panel displays, hard disk media, CD glass, memory and optical media, MEMS devices, and various other substrates on which micro-electronic, micro-mechanical, or micro-electromechanical devices are or can be formed. These are collectively referred to here as workpieces or wafers. Descriptions here of semiconductors, or the semiconductor industry or manufacturing processes, also includes the workpieces listed above, and their equivalents.

Figure 1:
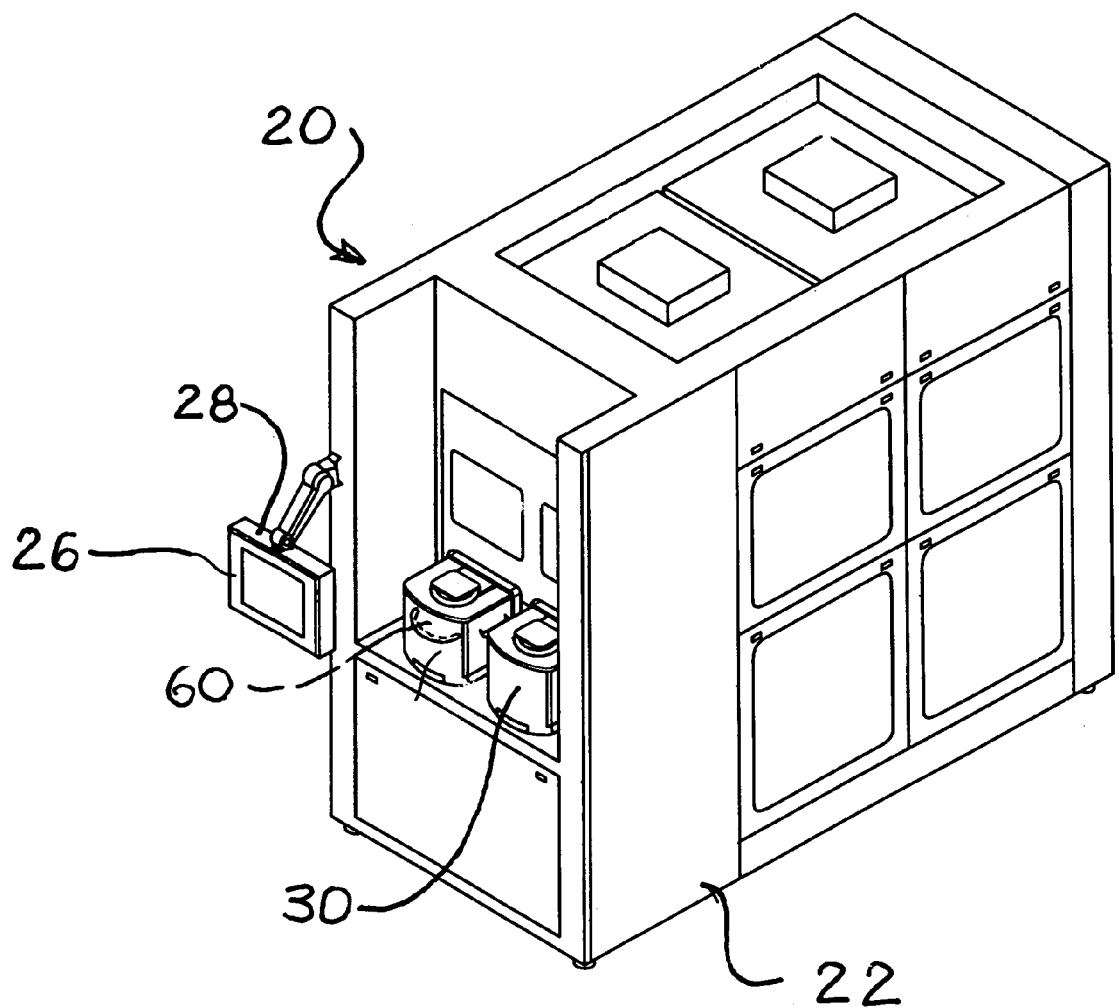
FIG. 1 is a perspective view of a processing system.
Figure 2:
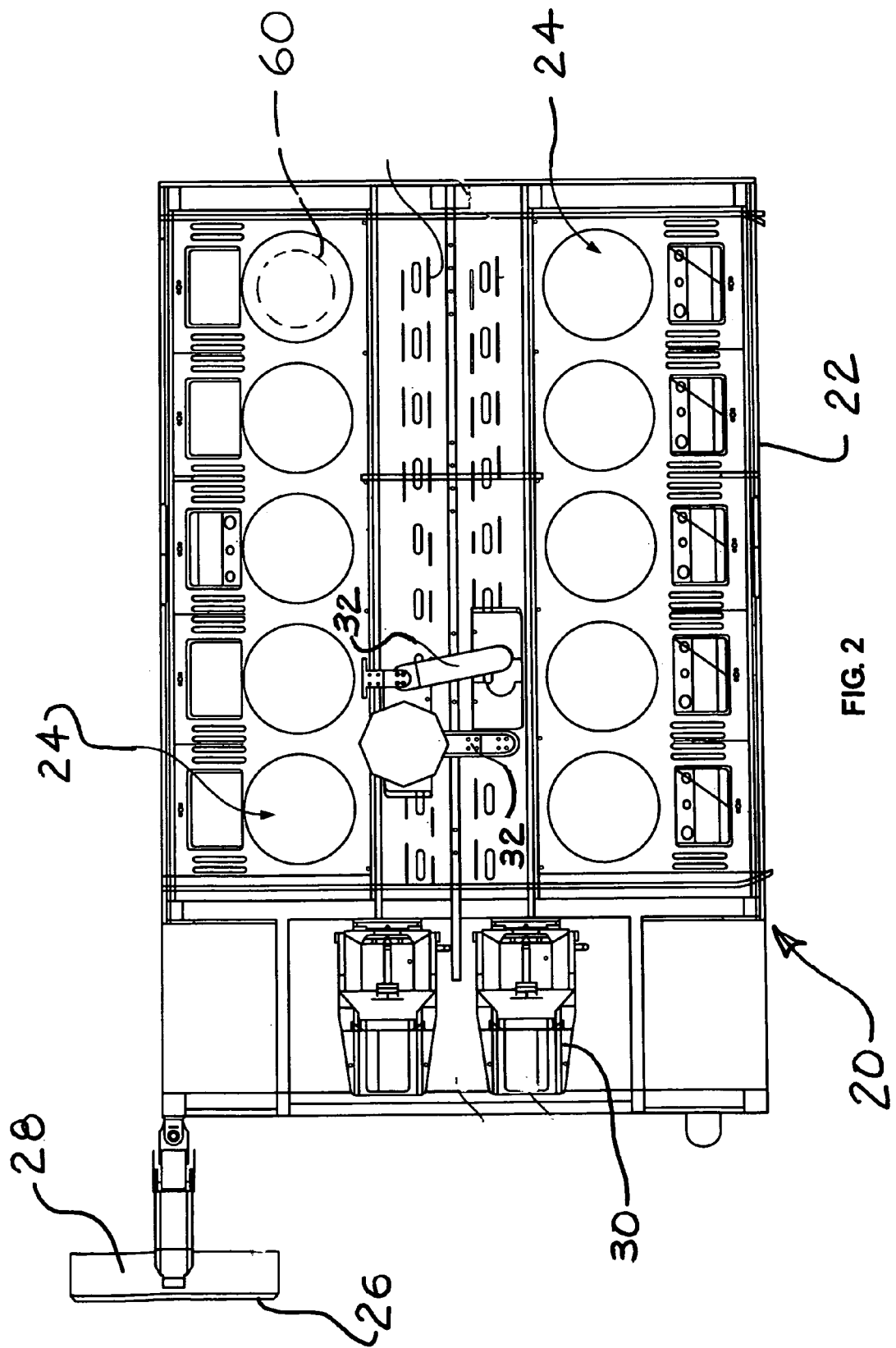
FIG. 2 is a plan view of the system shown in FIG. 1 (with the top enclosure surface removed for illustration).

Turning now to the drawings, as shown in FIGS. 1 and 2, as one example, a processing system 20 includes one or more processors 24 within an enclosure 22. A control/display panel 26 is typically provided with the processing system 20, to allow system operators to monitor various operations, as well as entering or modifying system instructions and software. One or more computer controllers 28 is also typically provided with the processing system 20 for controlling various system operations. The computer controller 28 may be connected via data links to one or more other computers associated with the manufacturing facility. Workpieces or wafers 60 are typically moved to the processing system 20 in boxes or containers 30. One or more robots 32 within the system 20 carry workpieces 60 between the containers 30 (or other input/output assembly or location) and one or more of the processors 24 (or between different processors). The system 20 may include various features described in U.S. Pat. No. 6,900,132 incorporated herein by reference. FIGS. 1 and 2 show a representative system 20. The size, shape, and arrangement of components in these Figures are not essential. Various other systems may also be used.

Turning now to FIGS. 3-6, a typical processor 24 is shown. Various types of processors 24 may be used, for example, spray acid processors, spray solvent processors, spray coating processors, etc. The processor 24 may also include a centrifugal swing arm spray component, such as described in U.S. Patent Publication No. 2004/0013797, incorporated herein by reference.

Figure 5:
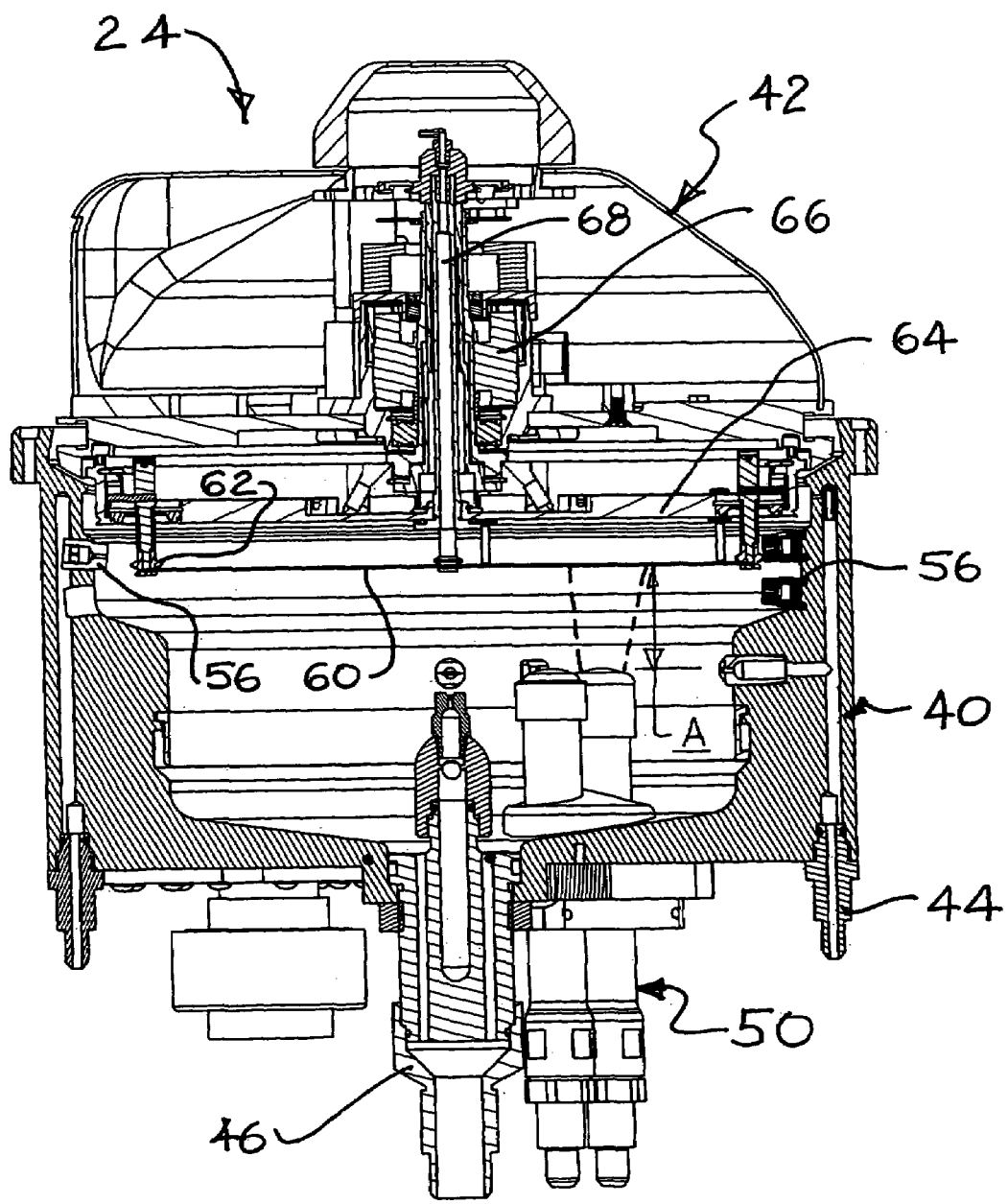
FIG. 5 is a section view taken along line 5-5 of FIG. 4.
Figure 6:
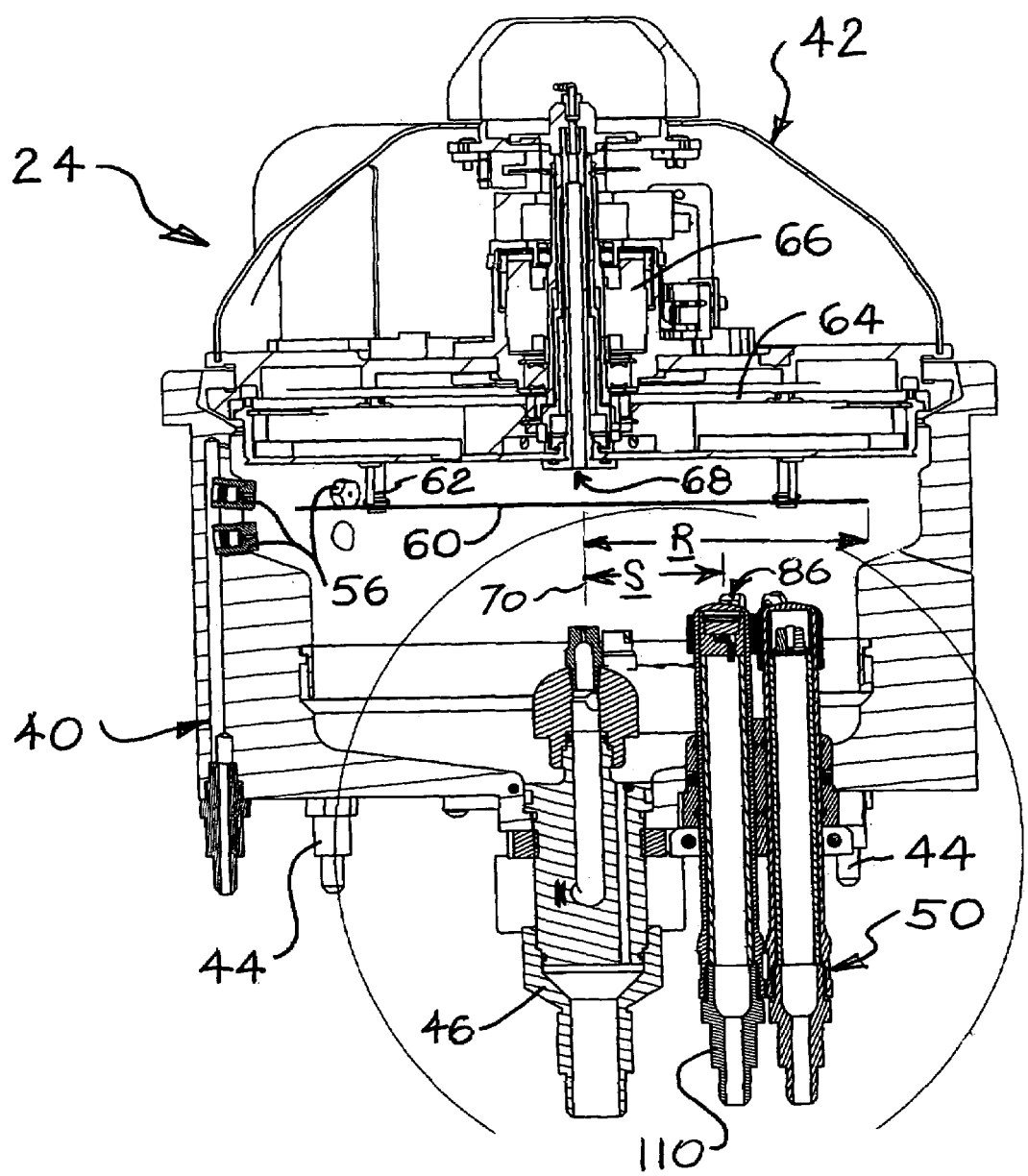
FIG. 6 is a section view taken along line 6-6 of FIG. 4.

Referring to FIGS. 3-6, in the example shown, the processor 24 has a head 42 which may be lowered into engagement with a bowl 40. The head 42 may be lifted away from the bowl 40, and optionally inverted, to load or unload a workpiece, via a head lifter or elevator (not shown). The head 42 advantageously holds and spins a workpiece 60. Although various workpiece holding designs may be used, FIGS. 5 and 6 show a workpiece 60 held by fingers 62 supported on a rotor 64. The rotor 64 may be rotated by a motor 66. A process liquid or gas inlet 68 may optionally be provided to introduce a process liquid or gas onto the up-facing side of the workpiece 60 (typically the back or non-device side).

The bowl 40 may have various process liquid or gas inlets 44, and a liquid drain assembly 46. Spray nozzles 56 and/or flood nozzles may also be used. The use of liquid and/or gas nozzles, the number and types of nozzles, as well as the process liquids and gasses used, may vary with the design of the processor 24 and with the specific manufacturing steps to be carried out by the processor 24.

Figure 7:
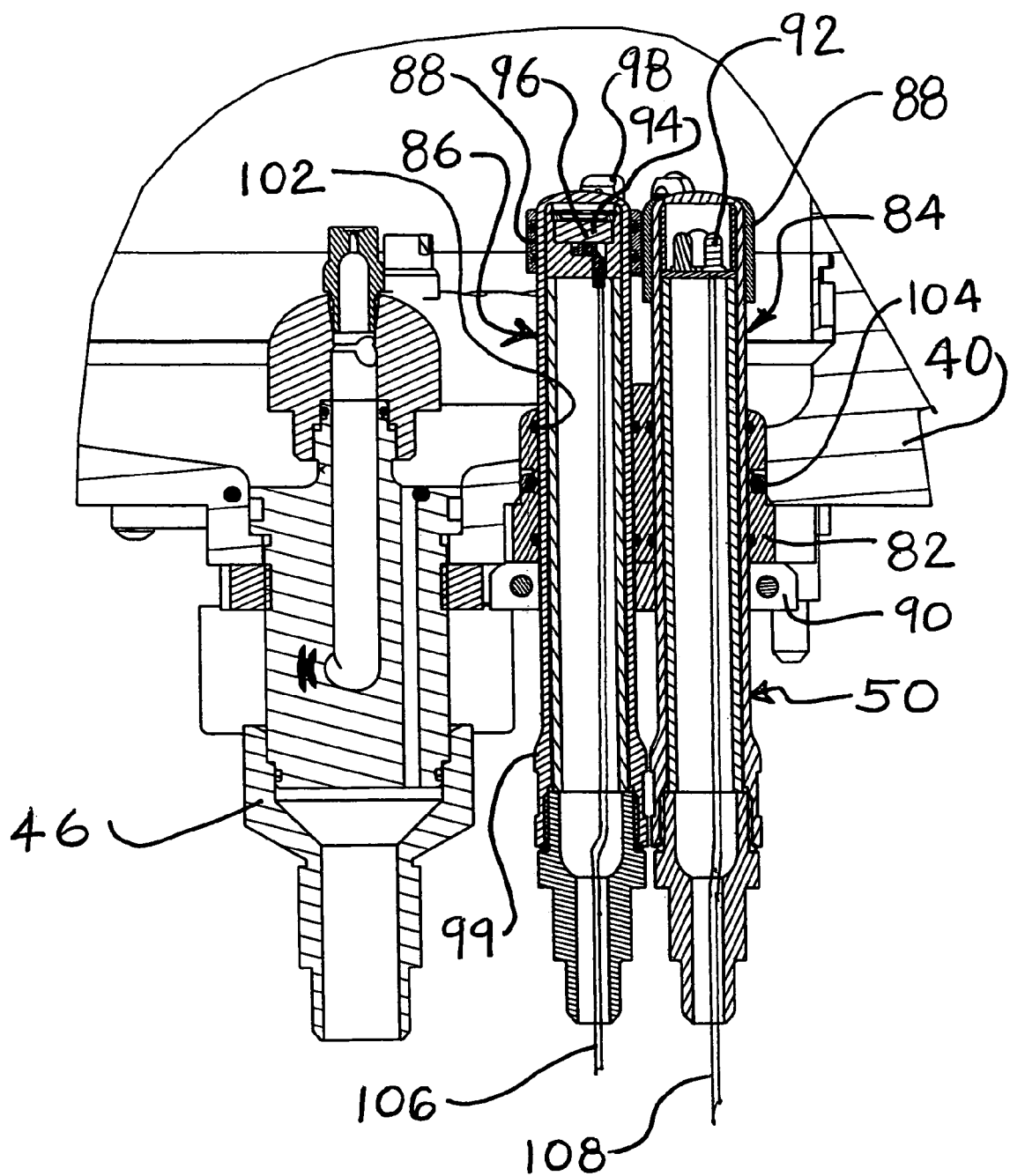
FIG. 7 is an enlarged detail view of the lower section of the processor shown in FIG. 6.

Referring now to FIGS. 6, 7, and 8, an end point detector generally designated at 50 is provided on or in the processor 24. The end point detector 50 includes a light emitter assembly 84 and a light detector assembly 86, which may be held in place by a mounting collar 82. The mounting collar 82 may fit within an opening in the bottom of the bowl 40, and may be sealed via an O-ring 104.

Figure 9:
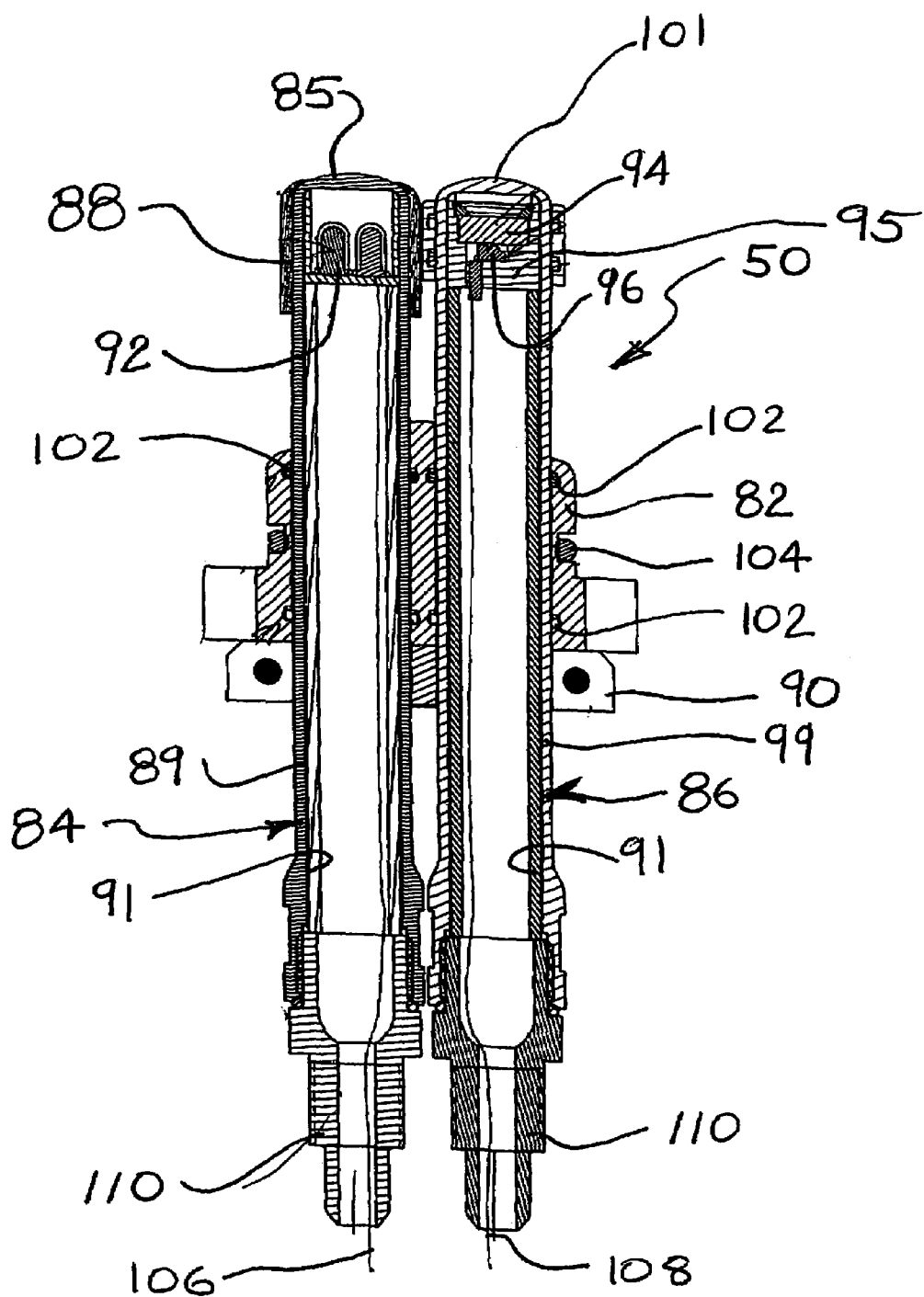
FIG. 9 is an enlarged section view taken along line 9-9 of the FIG. 8.
Figures 10, 11:
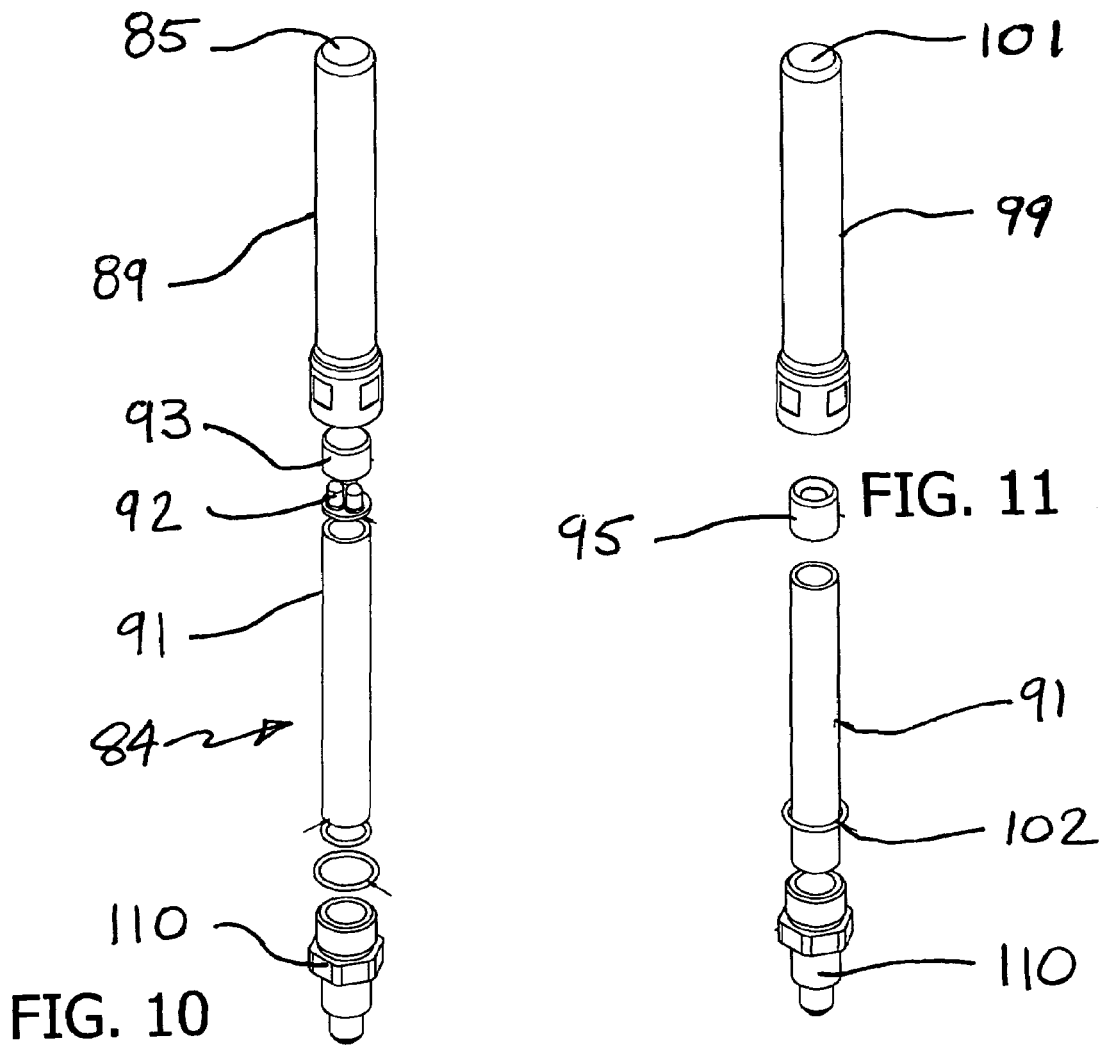
FIG. 10 is an exploded perspective view of the light emitter shown in FIGS. 7-9.
FIG. 11 is an exploded perspective view of the light detector shown in FIGS. 7-9.
Figure 12:
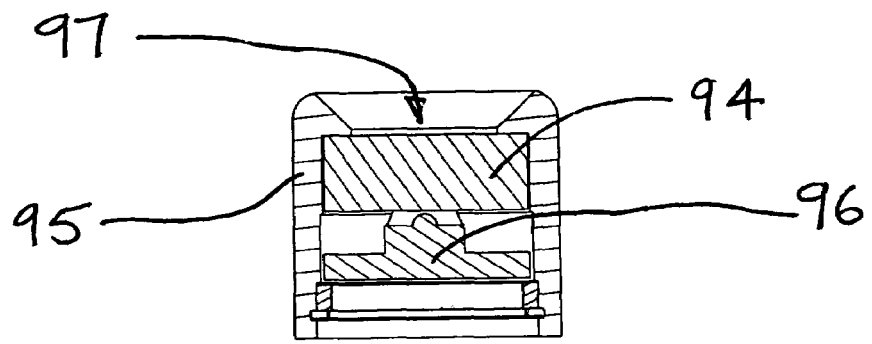
FIG. 12 is an enlarged section view of the upper end of the light detector shown in FIGS. 8-11.

Turning specifically to FIGS. 7, 9, and 10, the light emitter assembly 84 may include one or more LEDs 92, or other light emitting element, positioned within a housing or tube 89. In the design shown, a cluster of four LEDs 92 is used. Single wavelength light sources can provide improved performance. The top end 85 of the tube 89 is closed, while the bottom end of the tube 89 may be left open. A spacer 93 and a sleeve 91 hold the LED 92 in position adjacent to the top end 85. A wire fitting 110 is attached to the bottom end of the tube 89. The tube 89 is advantageously made of a translucent material which is resistant to process chemicals, e.g., a material such as fluorine resins (Teflon).

Referring now to FIGS. 7, 9, 11, and 12, an optical filter 94 may be positioned above a light sensor 96 in an end cap 95 having an open top end 97. The end cap 95 containing the sensor 96 and filter 94 is positioned within a housing or tube 99, similar to the tube 89. The end cap 95 is secured in place adjacent to the upper end 85 of the tube 99, shown in FIG. 11, by a sleeve 91, when a wire fitting 110 is attached to the lower end of the tube 99. Although the LED 92 and light sensor 96 are shown in the process chamber, adjacent to the workpiece, one or both of them may also be located elsewhere, and provided with an optical link (such as a fiber optic element) into the chamber.

As shown in FIG. 9, O-rings 102 seal the mounting collar 82 around the outside surface of the light emitter assembly tube 89 and detector assembly tube 99. An opaque shield ring 88 may be provided at the upper end of the light emitter assembly 84. Wire leads 106 extend up through the open bottom end of the light emitter assembly 84 to the LED 92. Similarly, wire leads 108 extend up through the open bottom end of the detector assembly 86 to the light sensor 96. The wire leads 106 and 108 connect directly or indirectly to the computer controller 28. A purge gas outlet 98 may be provided adjacent to the top end of the detector assembly 86, with a nozzle positioned to direct a spray of gas onto or over the top end 85 of the detector assembly 86 and/or the light emitter assembly 84. A split positioning collar 90 may be loosened to allow for vertical positioning of the light emitter assembly 84 and the light detector assembly 86, and then retightened to secure them into place.

As shown in FIG. 5, the top end 85 of the detector assembly 86 is positioned below the workpiece 60 by a dimension A which may be 5-25 mm, 10-20 mm, or about 15 mm. The upper end of the light emitter assembly 84 may be at the same vertical position, or higher or lower than the detector assembly 86.

As shown in FIG. 6, the detector assembly 86 is located between the center and edge of the workpiece 60. The center of the workpiece 60 is nominally on the center line/spin axis 70 of the head 42. The dimension S in FIG. 6 showing the position of the detector assembly 86, is generally 20-80%, 30-70%, 40-60%, or about 50% of the workpiece radius R.

In use, a workpiece 60 is loaded into the processor 24. Processing is carried out on the workpiece 60 by spinning the workpiece and by applying one or more liquid, gas, or vapor process chemicals. The LEDs 92 in the light emitter assembly 84 are switched on. The light emitted from the LEDs 92 is preferably directed upwardly in a direction substantially perpendicular to the workpiece 60, as indicated by the dotted lines in FIG. 5, although the specific direction of emitted light is not essential. The end 85 of the tube 89 is sufficiently thin (typically 0.5-4 mm or 1-2 mm), and the tube material is transparent or translucent enough to allow sufficient light to pass through the end 85 and impinge on the workpiece 60. The light is diffused as it passes through the tube end 85. As the workpiece is processed, the reflectance or color of the workpiece changes. For example, where a metal layer overlying a dielectric layer is etched, the reflectance of the workpiece surface decreases (since the metal layer is more reflective than the dielectric layer). The color may also change.

Consequently, the amount of light and/or the color of light reflected from the workpiece changes as processing proceeds. Reflected light is detected by the detector assembly 86. Reflected light passes through the end 101 of the tube 99, through the filter 94 (if used) and to the sensor 96. The tube end 101 acts to diffuse light entering the detector assembly 86. The sensor 96 provides a voltage output which varies with the amount of light, and color of light impinging on the sensor 96. The filter 94 is preferably selected to pass light of the same wavelength as the light emitted by the LEDs 92. Accordingly, stray light, for example, ambient room light passing through the walls of the bowl 40, is effectively filtered out. Electronic filters and/or signal processing may be used with, or instead of, the optical filter 94. The LEDs may also be driven in an electronically chopped mode, to suppress noise from stray light sources. The signal from the sensor 96 is provided to the computer controller 28 through the wire leads 108. The computer controller 28 then determines when processing is complete, based on the output from the sensor 96. Specifically, the computer controller 26 processes the signal from the sensor 96, using known techniques which may be based on initial calibration of the processor and the specific process steps used.

If necessary, purge gas may be sprayed onto the top end 85 of the detector assembly 86, to remove excessive liquid droplets which may interfere with light entering into the detector assembly. The ends 85 and 101 of the light emitter and light detector assemblies may be curved to help to avoid any accumulation of liquid on them.

While the processor 24 is shown in an upright or vertical orientation, with the workpiece horizontal, the end point detector 50 may operate with processors having other orientations. In addition, while the end point detector 50 is shown in a single wafer processor, it may also be used in batch processing.

The optical filter 94 may optionally be replaced by electronic filters. The LEDs 92 may be selected based on the specific materials on the workpiece 60. The difference in reflectivity of various films and layers typically changes with the wavelength of light. Accordingly, for processors 24 intended for processing workpieces 60 having specific films or layers, the LEDs may be selected so that the change in reflectance is increased. For example, copper is a good reflector of near infrared light, whereas Titanium/Tungsten is a poor reflector of near infrared light. For applications where a copper layer overlying a Titanium/Tungsten layer is etched, LEDs emitting at near infrared wavelengths may be selected over other types of LEDs, to increase the change in reflectance. This provides an end point detector 50 having a greater sensitivity.

The computer controller 28 may be programmed to correctly determine the end point of various different processes. When the end point is detected, processing will generally be continued for a predetermined amount of additional time. The computer controller 28 may run consecutive process steps. The computer controller 26 can identify end points of each of the steps, and then control the processor 24 to stop processing, continue processing for a specific interval, commence rinsing, or take other action. The computer controller may be programmed to monitor the light intensity profile as the workpiece is processed. Once a consistent pattern of intensity change is established, a detection routine may be used to determine the end point. An absolute reflectance threshold may be used. For example, determining that the end point occurs when absolute reflectance drops below 50%, 40%, 35% or 30%. Alternatively, the first derivative of the reflected light signal with respect to time may be calculated to look at change in reflectance, rather than absolute reflectance. This may be especially useful for transparent films where the signal can vary sinusoidally (due to Fresnel reflectance as the film becomes thinner). Here, the end point occurs where the derivative of the reflected signal stabilizes at zero (i.e., constant reflectance) after crossing that value several times during the etch process.

Since the light emitted from the LEDs 92 is diffused as it passes out from the light emitter assembly 84, and as the light entering the detector assembly 86 is similarly diffused before reaching the sensor 96, alignment and/or positioning of the light emitter and detector assemblies is not critical.

Thus, a novel system, processor, and end point detector, and corresponding methods have been shown and described. This invention, therefore, should not be limited, except to the following claims and their equivalents.

What is claimed is:

1. A workpiece processor system for processing at least one workpiece, comprising:
   one or more workpiece processors;
   a robot moveable to load and unload a workpiece into and out of one or more of the processors;
   a controller for controlling operation of the workpiece processors and the robot; and
   an optical end point detector assembly in one or more of the workpiece processors, comprising:
      a light emitter tube including an emitter tube light diffuser and a light emitting element; and
      a light detector tube including a detector tube light diffuser and a light sensor.

2. The system of claim 1 further comprising a purge gas outlet adjacent to a closed first end of the detector tube.

3. The system of claim 1 wherein the workpiece processors are single workpiece processors, and wherein the workpiece processors each include a workpiece holder adapted to hold a generally flat workpiece in a horizontal position.

4. The system of claim 1 with the optical end point assembly electrically linked to the controller and with the controller including means for determining a processing end point based on an output from the optical end point detector assembly.

5. The system of claim 1 with at least one of the workpiece processors including a bowl having a bottom wall, and with the optical end point detector assembly extending through the bottom wall.

6. The system of claim 1 with at least one of the workpiece processors having a workpiece holder comprising a head including a rotor for holding and spinning the workpiece.

7. The system of claim 1 wherein the light emitting element comprises one or more LEDs for emitting light in a direction substantially perpendicular to the workpiece.

8. The system of claim 5 with the emitter tube and the detector tube extending through a mounting collar sealed with the bottom wall of the bowl, and with the emitter and detector tubes substantially slidable through the mounting collar to adjust positioning of the emitter and detector tubes in the bowl.

9. The system of claim 6 with the workpiece holder adapted to hold a workpiece at a processing position, and wherein the optical end point detector assembly has a first end positioned from about 5-25 mm from the workpiece holding position.

10. The system of claim 7 with the detector tube light diffuser made of a translucent or transparent material, and with the light sensor located adjacent to a closed first end of the detector tube.

11. The system of claim 7 further comprising an optical filter in the light detector tube positioned to filter light impinging on the light sensor, and with the filter adapted to substantially pass light at a wavelength emitted by the LEDs while filtering out light at other wavelengths.

12. The system of claim 7 wherein the LEDs are located adjacent to a closed first end of the light emitter tube.

13. The system of claim 12 further comprising an optical shield around the first end of the light emitter tube.

14. The system of claim 12 wherein the emitter tube light diffuser comprises fluorine resins and the closed first end of the light emitter tube has a wall thickness ranging from about 0.5 to 5 mm.

15. A workpiece processor comprising:
a process chamber;
a rotor in the process chamber;
one or more workpiece holders on the rotor; and
an optical end point detector assembly in the process chamber including a light emitter assembly and a light detector assembly, with the light detector assembly including:
a housing including a closed end and comprising a light diffusing material, and
a light sensor in the housing for receiving reflected light diffused by the housing, with the light sensor located adjacent to the closed end of the housing.

16. The workpiece processor of claim 15 with process chamber having side walls joined with a bottom wall, and with the optical end point detector assembly extending upwardly through the bottom wall.

17. The workpiece processor of claim 15 wherein the light emitter assembly includes a light source comprising one or more LEDs which emit light at a first wavelength, and wherein the light detector assembly further includes an optical filter that passes light at the first wavelength and substantially filters out other light.

18. A workpiece processor comprising:
a process chamber;
one or more workpiece holders in the process chamber; and
an optical end point detector assembly in the process chamber including a light emitter assembly and a light detector assembly, with the light detector assembly including:
a housing comprising a light diffusing material;
an end cap in the housing including an open top end;
a light sensor in the end cap; and
an optical filter in the end cap, positioned between an interior surface of the housing and the light sensor, for filtering diffused light impinging on the light sensor.

* * * * *